(12) United States Patent
Fujita et al.

(10) Patent No.: US 11,437,889 B2
(45) Date of Patent: Sep. 6, 2022

(54) WORK DEVICE WITH AIR-COOLED LINEAR MOTOR

(71) Applicant: FUJI CORPORATION, Chiryu (JP)

(72) Inventors: Yoji Fujita, Okazaki (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 232 days.

(21) Appl. No.: 16/649,388

(22) PCT Filed: Sep. 25, 2017

(86) PCT No.: PCT/JP2017/034500
§ 371 (c)(1),
(2) Date: Mar. 20, 2020

(87) PCT Pub. No.: WO2019/058546
PCT Pub. Date: Mar. 28, 2019

(65) Prior Publication Data
US 2020/0303995 A1    Sep. 24, 2020

(51) Int. Cl.
*H02K 9/18* (2006.01)
*H05K 13/04* (2006.01)
(Continued)

(52) U.S. Cl.
CPC ............... *H02K 9/18* (2013.01); *H02K 5/20* (2013.01); *H02K 9/16* (2013.01); *H02K 9/20* (2013.01);
(Continued)

(58) Field of Classification Search
CPC .. H02K 9/18; H02K 9/16; H02K 9/20; H02K 5/20; H02K 41/031; H05K 13/0409; H05K 13/0401
(Continued)

(56) References Cited

U.S. PATENT DOCUMENTS

| | | | |
|---|---|---|---|
| 2010/0181848 A1* | 7/2010 | Nagasaka | H02K 41/03 310/12.29 |
| 2013/0169079 A1 | 7/2013 | Andrikowich et al. | |
| 2021/0152054 A1* | 5/2021 | Kato | H02K 9/227 |

FOREIGN PATENT DOCUMENTS

| | | |
|---|---|---|
| CN | 104025434 A | 9/2014 |
| JP | 2005-277212 A | 10/2005 |

(Continued)

OTHER PUBLICATIONS

Machine translation of JP-2010172071-A. (Year: 2010).*
International Search Report dated Dec. 12, 2017 in PCT/JP2017/034500 filed on Sep. 25, 2017, 1 page.

*Primary Examiner* — Michael Andrews
(74) *Attorney, Agent, or Firm* — Oblon, McClelland, Maier & Neustadt, L.L.P.

(57) ABSTRACT

A work device including a cover provided on a base to form a work space between the cover and the base; a linear motor disposed in the work space having an extended stator and a movable element moving along the stator in a transfer direction; and a work executing section provided on the movable element to execute a predetermined work; wherein the movable element includes: a heat-dissipating section to dissipate heat generated from a constituent member to air, the constituent member constituting at least one of the movable element and the work executing section; a duct, covering the heat-dissipating section, having an intake port and an exhaust port; and a blower to blow the air from the intake port of to the exhaust port.

7 Claims, 6 Drawing Sheets

(51) Int. Cl.
*H02K 5/20* (2006.01)
*H02K 9/16* (2006.01)
*H02K 9/20* (2006.01)
*H02K 41/03* (2006.01)

(52) U.S. Cl.
CPC ......... *H02K 41/031* (2013.01); *H05K 13/041* (2018.08); *H05K 13/0409* (2018.08)

(58) Field of Classification Search
USPC ...................................................... 310/12.18
See application file for complete search history.

(56) References Cited

FOREIGN PATENT DOCUMENTS

| | | | |
|---|---|---|---|
| JP | 2010-172071 A | | 8/2010 |
| JP | 2010172071 A | * | 8/2010 |
| JP | 2014-96889 A | | 5/2014 |
| JP | 2017-59608 A | | 3/2017 |

\* cited by examiner

WORK DEVICE WITH AIR-COOLED LINEAR MOTOR

TECHNICAL FIELD

The present specification relates to a work device having a work executing section moved by a linear motor, and more particularly, to an air-cooled heat-dissipating structure of the work device.

BACKGROUND ART

Technology for mass producing circuit boards by performing various operations for mounting components on printed circuit boards has become widespread. Specific work devices for performing various operations include solder printing devices, component mounting devices, reflow devices, and board inspection devices. A component mounting device generally includes a board conveyance section, a component supply section, and a component transfer section. The component transfer section includes a mounting head for holding a suction nozzle, a head drive mechanism for driving the mounting head in two horizontal directions, and the like. A linear motor or the like is used for the head drive mechanism. Examples of techniques employing such a component mounting device are disclosed in Patent Literature 1 and 2.

The embodiment of Patent Literature 1 discloses a component mounting device with a cover covering the entire region in the transfer direction of a movable element of a linear motor constituting a head driving mechanism, a duct connected to the cover, and a blower for taking low-temperature air into the cover and discharging high-temperature air from the duct. With this air-cooling type heat-dissipating structure, high-temperature air can be directly discharged to the outside of the device. Accordingly, the component mounting device of Patent Literature 1 is superior in heat-dissipating performance as compared with a configuration in which high-temperature air is first discharged to a work space inside the device and then ventilated from the work space.

Patent Literature 2 discloses a component mounting device including a component mounting space covered with a cover and an air supply unit for increasing the air pressure inside the component mounting space above atmospheric pressure. With this configuration, intrusion of dust can be prevented as much as possible, and consequently it is unnecessary to perform frequent maintenance and the operation rate is improved.

PATENT LITERATURE

Patent Literature 1: JP-A-2010-172071
Patent Literature 2: JP-A-2005-277212

Brief Summary

Technical Problem

Incidentally, the Technology of Patent Literature 1 is excellent in heat-dissipating performance, but the cover and the duct covering the entire region in the transfer direction of the movable element are large in size. This makes the entire component mounting device bulky. In addition, dust can potentially intrude into the work space inside the cover since the pressure of the work space becomes negative due to the blower. When the technology of Patent Literature 2 is applied to solve this problem, an air supply unit having a larger capacity than that of the blower is required, thereby lowering the efficiency. The problem of such an air-cooling type heat-dissipating structure is not limited to the component mounting device, but is common to various types of work devices provided with a work executing section moved by a linear motor.

The present specification provides a work device having a simple configuration and excellent heat-dissipating performance.

Solution to Problem

The present specification discloses a work device, comprising: a cover provided on a base configured to form a work space between the cover and the base; a linear motor disposed in the work space having an extended stator and a movable element moving along the stator in a transfer direction; and a work executing section provided on the movable element to execute a predetermined work, wherein the movable element includes: a heat-dissipating section configured to dissipate heat generated from a constituent member to air, the constituent member constituting at least one of the movable element and the work executing section; a duct, covering the heat-dissipating section, which has an intake port and an exhaust port; and a blower configured to blow the air from the intake port to the exhaust port; and the cover includes: an intake opening corresponding to the intake port in a transfer region in which the movable element moves in the transfer direction; and an exhaust opening corresponding to the exhaust port in the transfer region.

Advantageous Effects

With the work device disclosed in this specification, the low-temperature air outside the device is directly taken into the heat-dissipating section from the intake opening of the cover and through the intake port of the duct. The air which becomes hot in the heat-dissipating section is directly discharged to the outside of the device from the exhaust port of the duct and through the exhaust opening of the cover. Thus, it is not necessary to ventilate the work space in the device, and, as a result of drawing in and discharging air efficiently, the heat-dissipating performance is excellent.

Also, since the duct moves together with the movable element, the duct is small without extending a long distance into the transfer region, and instead, the intake and exhaust openings of the cover extend across the transfer region. In addition, the blower can be small because its target is the volume of the heat-dissipating section which is much smaller than the work space. Therefore, the air-cooling type heat dissipation structure has a simpler configuration than a conventional one, and an increase in the bulkiness of the work device is avoided.

DESCRIPTION OF EMBODIMENTS

1. Overall Configuration of Component Mounting Device 1 (Work Device of the Embodiment)

Figure 1:
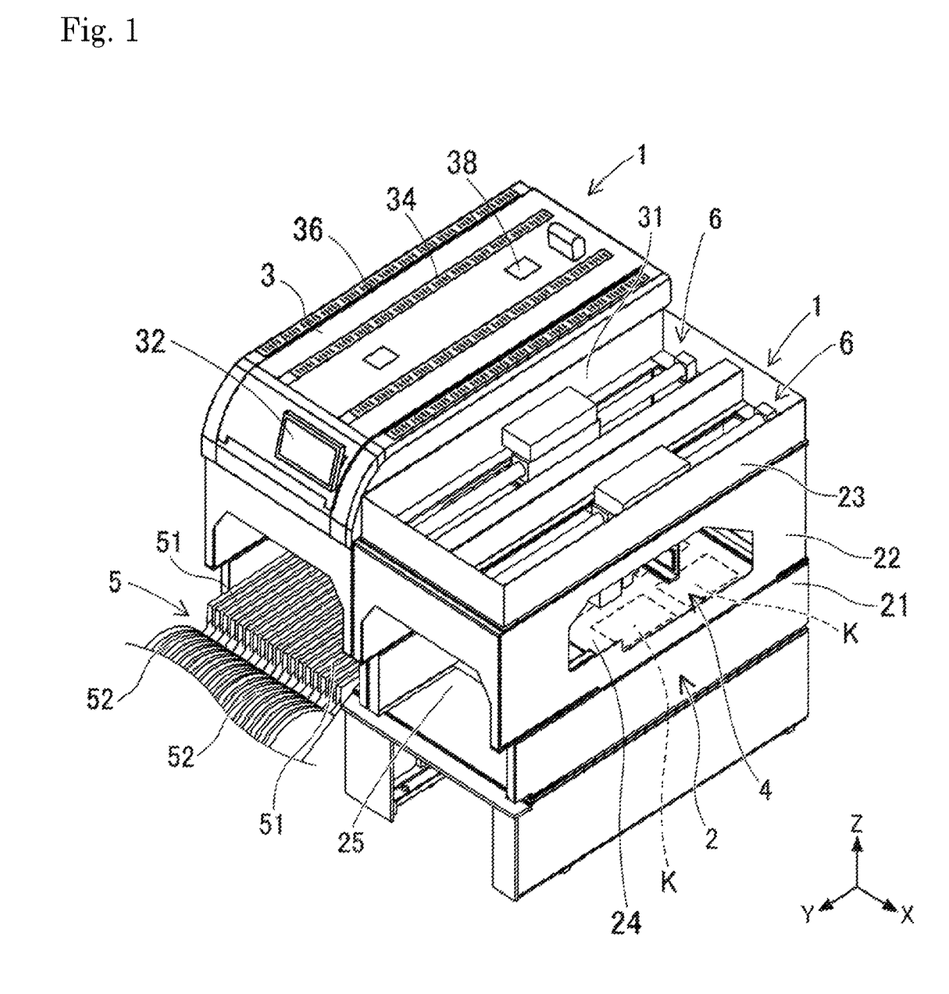
FIG. 1 A perspective view showing a state in which two component mounting devices, which are examples of the work device of an embodiment of the present disclosure, are arranged in parallel.

A work device of an embodiment will be described with reference to FIGS. 1 to 6. FIG. 1 is a perspective view showing a state in which two component mounting devices 1, which are examples of the work device of the embodiment, are arranged side by side. The direction from the upper left to the lower right in the drawing of FIG. 1 is the X-axis direction for conveying board K, the direction from the upper right to the lower left in the drawing is the Y-axis direction (i.e., the front-rear direction), and the up-down direction in the drawing is the Z-axis direction (i.e., the height direction). Component mounting device 1 includes base 2, cover 3, board conveyance section 4, component supply section 5, and two component transfer sections 6. In the component mounting device 1 on the front right-hand side of FIG. 1, cover 3 and component supply section 5 are not shown.

Base 2 has a substantially rectangular-box shape that is open in the upward direction. Base 2 is formed by connecting lower frame 21, middle frame 22, and upper frame 23, one above the other, each frame being substantially rectangular in plan view. Both side faces of middle frame 22 in the X-axis direction have board transfer openings 24 for conveying board K in and out. When multiple component mounting devices 1 are arranged in parallel, or when component mounting device 1 and other types of work devices are arranged in parallel, board transfer openings 24 face each other. This makes it possible to transfer boards K between devices. Component supply opening 25 for mounting component supply section 5 is provided on the front faces of lower frame 21 and middle frame 22.

Cover 3 is provided on base 2 and covers the opening at the upper portion of base 2. Cover 3 forms work space 31 between cover 3 and base 2. Monitor device 32 is disposed on the front of cover 3. Monitor device 32 displays the progress of mounting work and accepts input settings from an operator.

Board conveyance section 4 is provided on base 2 and located inside work space 31. Board conveyance section 4 has two lanes capable of transferring two boards K together. Each lane of board conveyance section 4 has a conveyance unit and two positioning units. The conveyance unit includes a pair of guide rails, a pair of conveyor belts, and the like. With two boards K placed on the conveyor belts, the conveyor belts rotate along the guide rails. As a result, each of the two boards K are conveyed in and out of the mounting position. The two positioning units push up each board K at the mounting position and clamp the board K in a horizontal orientation. As a result, the two component transfer sections 6 can perform mounting work on each of the two boards K.

Component supply section 5 is disposed in component supply opening 25 of base 2 in an exchangeable manner. Component supply section 5 includes multiple feeders 51 arranged side by side in the X-axis direction. A carrier tape, in which a large number of components are accommodated in cavity sections, is wound around supply reel 52 and loaded into feeder 51. Feeder 51 feeds out the carrier tape at a constant pitch, and sequentially supplies components to a supply position near the leading end.

Figure 2:
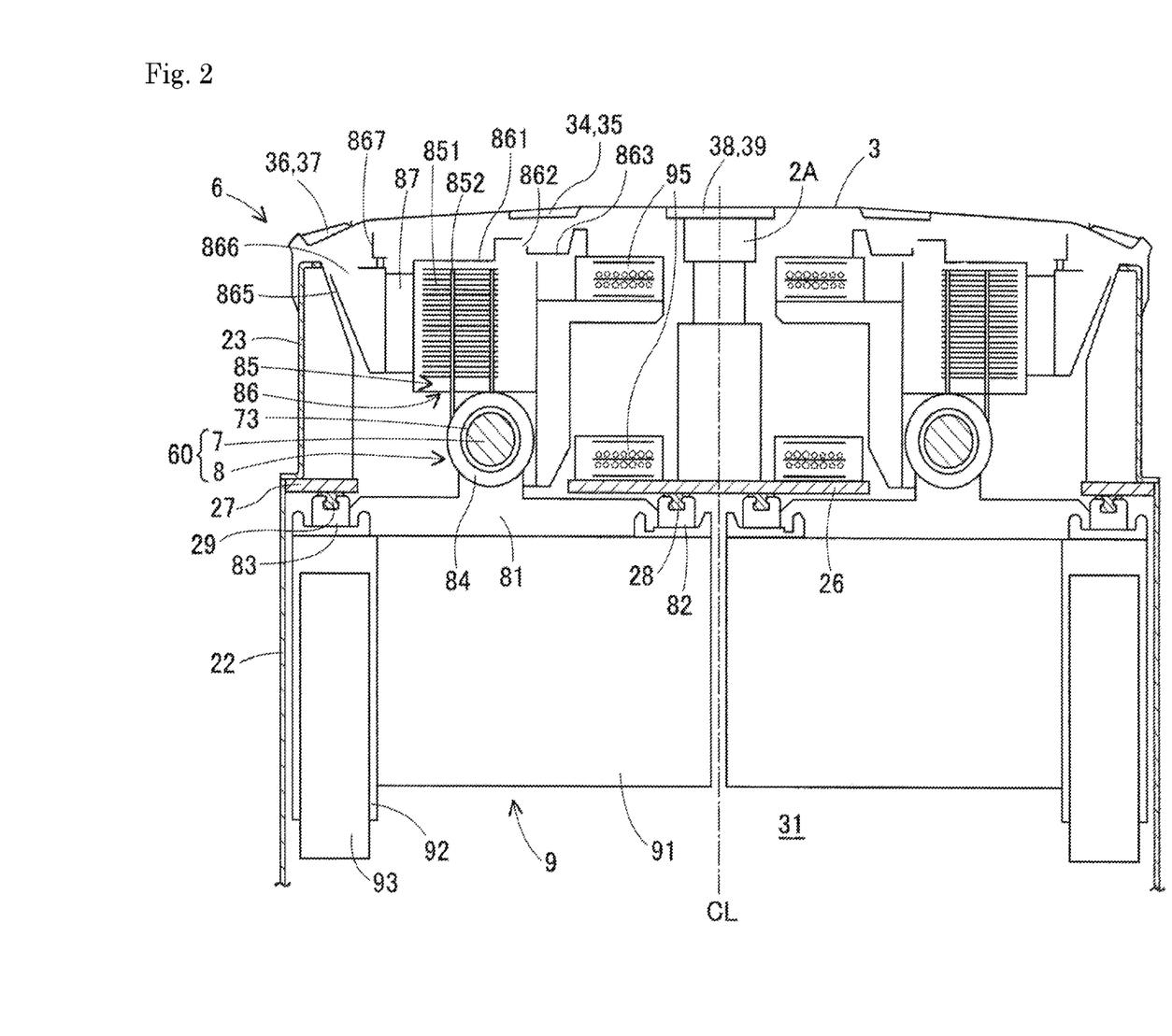
FIG. 2 A partial front cross-sectional view of the component mounting device showing a detailed configuration of a component transfer section.
Figure 3:
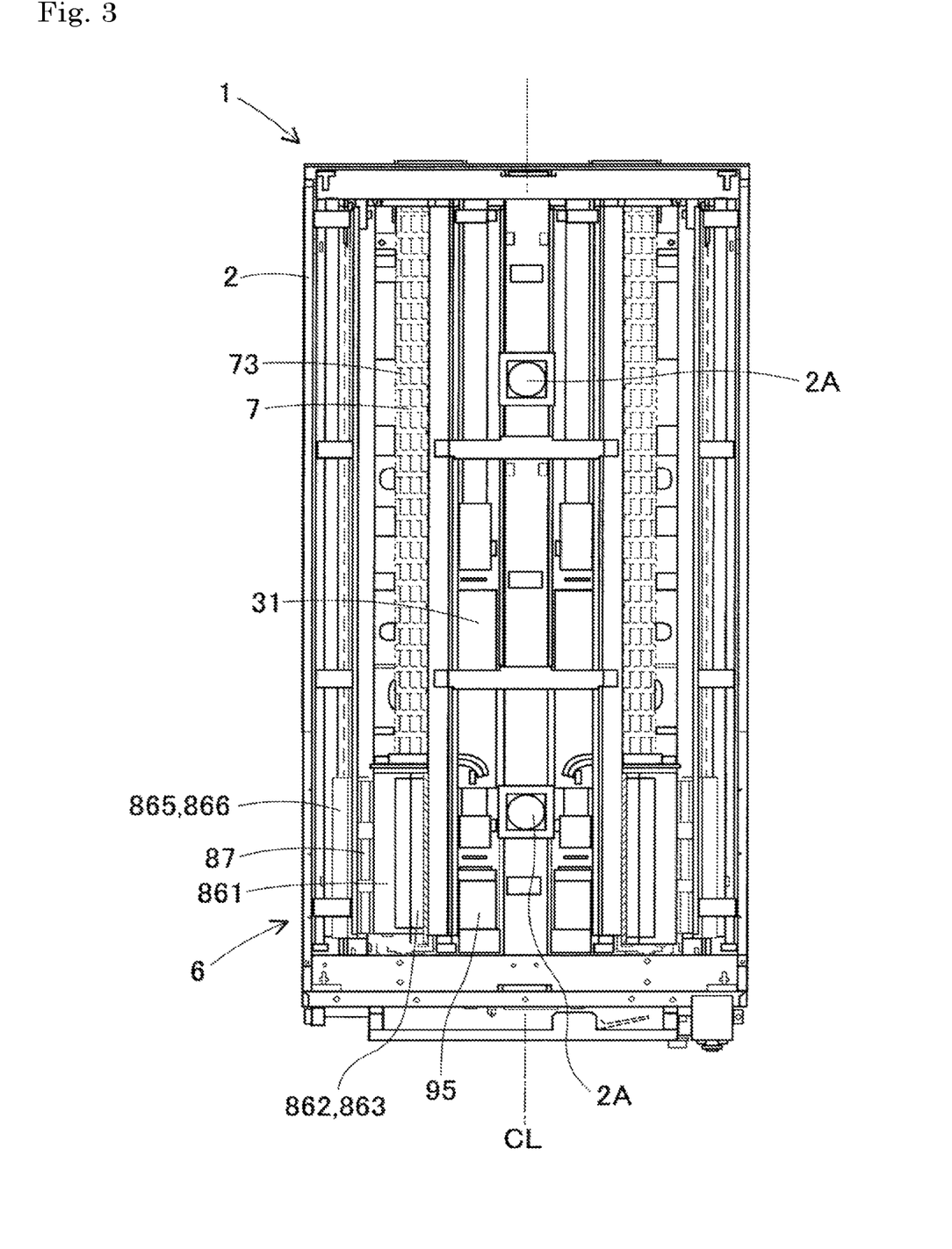
FIG. 3 A cross-sectional plan view of the component mounting device showing a detailed configuration of the component transfer section.
Figure 4:
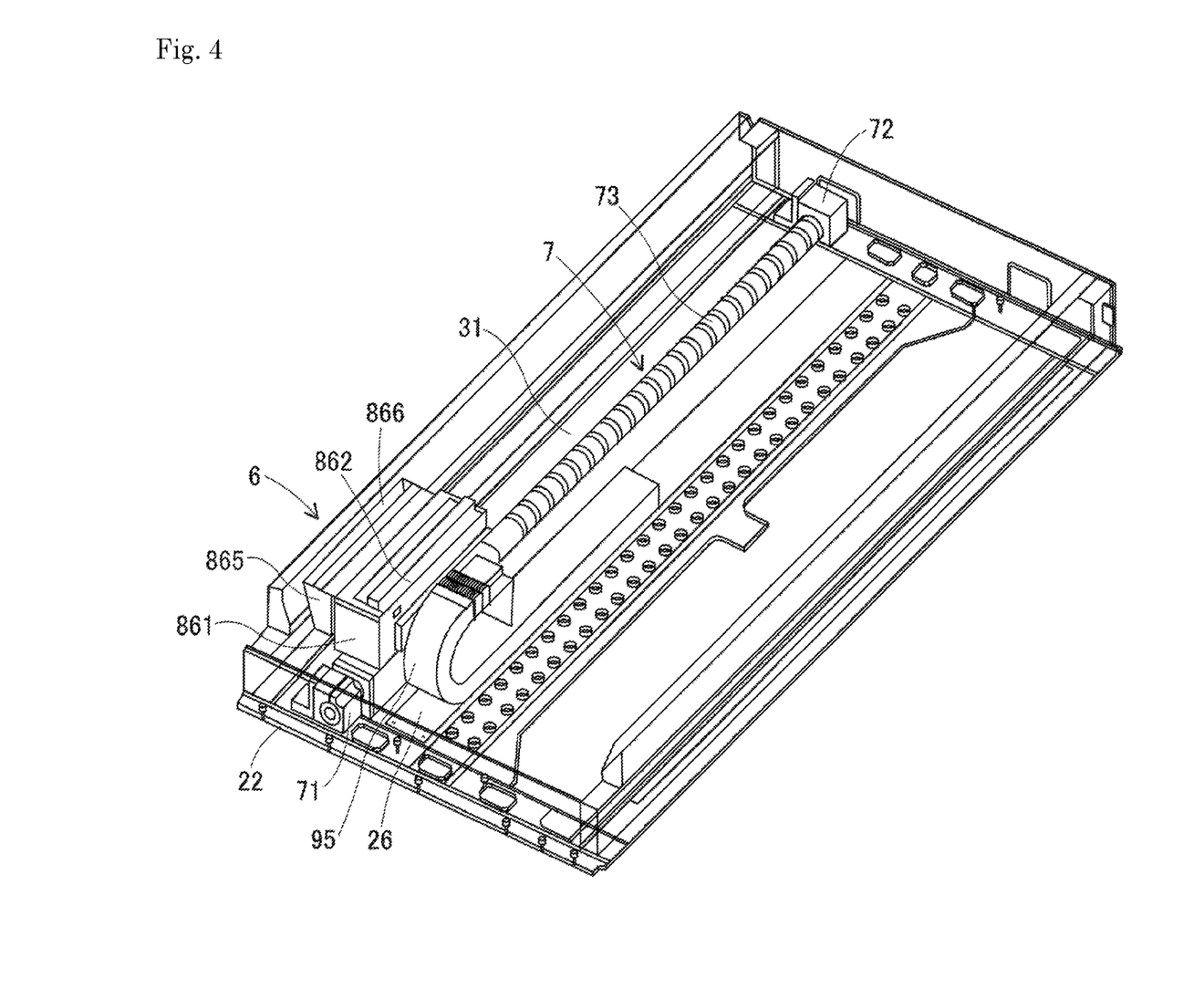
FIG. 4 A perspective view of the component transfer section as seen obliquely from above.

The two component transfer sections 6 are provided on base 2 and located inside work space 31. The two component transfer sections 6 are arranged symmetrically on the right and left sides of a centerline CL extending in the Y-axis direction. FIG. 2 is a partial front cross-sectional view of component mounting device 1 showing a detailed configuration of component transfer section 6. FIG. 3 is a cross-sectional plan view of component mounting device 1 showing a detailed configuration of component transfer section 6. FIG. 4 is a perspective view of component transfer section 6 as seen obliquely from above.

2. Configuration of Component Transfer Section 6

Mainly the left half of the bilaterally symmetrical configuration shown in FIG. 2 is denoted with symbols and will be described in detail. As shown, central support plate 26 is disposed on centerline CL near the upper portion of work space 31. Central support plate 26 spans from the front face to the rear face of the upper portion of middle frame 22 of base 2. In addition, side support plate 27 is disposed at a position close to the side face of base 2 near the upper portion of work space 31. Side support plate 27 also spans from the front face to the rear face of the upper portion of middle frame 22. Central rail 28 is disposed below central support plate 26. Side rail 29 is disposed below side support plate 27. Central rail 28 and side rail 29 extend in parallel in the Y-axis direction.

Component transfer section 6 includes linear motor 60, work executing section 9, and the like. Linear motor 60 includes stator 7 and movable element 8. Stator 7 is a shaft-shaped member extending in the Y-axis direction. Stator 7 is disposed at an intermediate position between central support plate 26 and side support plate 27 and slightly higher than central support plate 26 and side support plate 27. As shown in FIG. 4, in stator 7, front end 71 is fixed to the upper portion of the front face of middle frame 22, and rear end 72 is fixed to the upper portion of the rear face of middle frame 22. Multiple ring-shaped permanent magnets 73 are arranged along the Y-axis direction on the outer peripheral surface of shaft-shaped stator 7. As a result, N magnetic poles and S magnetic poles are alternately arranged along the Y-axis direction.

Movable element 8 includes movable main body section 81, center guide 82, side guide 83, linear drive coil 84, heat-dissipating section 85, duct 86, three blowers 87, and the like. Movable main body section 81 is disposed at a position slightly lower than central support plate 26 and side support plate 27. The length of movable main body section 81 in the Y-axis direction is much smaller than the length of stator 7, and the length of movable main body section 81 in the X-axis direction is smaller than the length of movable main body section 81 in the Y-axis direction.

Two center guides 82 are fixed at two positions in the Y-axis direction on the upper face near the centerline CL of movable main body section 81. Center guide 82 is engaged with central rail 28 and is freely movable in the Y-axis direction. Two side guides 83 are fixed at two positions in the Y-axis direction on the upper face of movable main body section 81 near the side face of base 2. Side guide 83 is engaged with side rail 29 and is freely movable in the Y-axis direction. Thus, movable element 8 is suspended from central support plate 26 and side support plate 27 such that movable element 8 can be moved in the Y-axis direction.

Multiple linear drive coils 84 are formed in a ring shape or a cylindrical shape. Linear drive coils 84 are disposed above the center position in the X-axis direction of movable main body section 81 and rotate around stator 7. The direction of electrical current flowing through the multiple linear drive coils 84 is controlled by the positional relationship of permanent magnets 73, generating a propulsion force in the Y-axis direction. As a result, movable element 8 moves in the Y-axis direction. By adopting such a suspended Y-axis direction moving system, a large space is afforded below movable element 8. A wide movement range in the X-axis direction is secured for mounting head 93, which will be described later.

Next, the air-cooled heat-dissipating structure of movable element 8 will be described. Heat-dissipating section 85 is disposed above linear drive coil 84. Heat-dissipating section 85 is composed of multiple heat-dissipating fins 851 and multiple heat pipes 852. Multiple heat-dissipating fins 851 extend parallel to the XY plane (i.e., the horizontal plane) and are spaced apart from each other in the Z-axis direction (i.e., the height direction). Multiple heat-dissipating fins 851 may extend parallel to the XZ plane and be spaced apart from each other in the Y-axis direction.

Multiple heat pipes 852 are erected from linear drive coil 84 and arranged with heat pipes 852 passing through multiple heat-dissipating fins 851. By convection of refrigerant inside heat pipes 852, heat generated in linear drive coil 84 is efficiently transferred to heat-dissipating fins 851. Water can be used as the refrigerant, but the refrigerant is not limited thereto. Heat-dissipating fins 851 radiate the transferred heat to the air.

Duct 86 includes intake duct 861 and exhaust duct 865. As shown in FIG. 2, intake duct 861 has a box shape in a front view. Intake duct 861 covers heat-dissipating section 85. Intake port 862 is provided on the upper portion of intake duct 861, on the side near centerline CL. Intake side tray 863 is disposed below intake port 862. Intake side tray 863 has a container shape with a raised peripheral edge. Intake side pan 863 restricts the flow of air from work space 31 into intake duct 861.

Three blowers 87 are arranged side by side in the Y-axis direction on the side face of intake duct 861 that is away from centerline CL. There are no particular restrictions on the structure and blowing capacity of blower 87, and the number of blowers 87 is not limited to three. Exhaust duct 865 is disposed on the side of blower 87 away from centerline CL. Blower 87 sends air in the X-axis direction from the side close to centerline CL to the side away from centerline CL. That is, blower 87 draws in air into intake duct 861 from intake port 862 and blows air to exhaust port 866 through exhaust duct 865 described below.

As shown in FIG. 2, exhaust duct 865 has a substantially V-shape in a front view. More specifically, the face of exhaust duct 865 on the side in contact with blower 87 stands directly upward. On the other hand, the face of exhaust duct 865 on the side opposite to blower 87 has an inclined surface that is further away from blower 87 as it goes upward. Exhaust port 866 is provided at the upper portion of the inclined surface. Internal flow control member 867 is disposed above exhaust duct 865 on the side close to blower 87. Internal flow control member 867 restricts the internal flow of air from the inside of exhaust duct 865 toward work space 31.

Work executing section 9 is provided on the lower side of movable main body section 81. Work executing section 9 includes, for example, Y-axis slider 91, X-axis slider 92, and mounting head 93. Y-axis slider 91 moves integrally with movable element 8 in the Y-axis direction. Y-axis slider 91 has an X-axis rail and an X-axis drive mechanism (not shown). X-axis slider 92 is loaded on the X-axis rail and is driven by the X-axis drive mechanism to move in the X-axis direction. Mounting head 93 is installed on X-axis slider 92 in an exchangeable manner. Mounting head 93 has one or multiple suction nozzles for picking up components by suction and mounting the components, and performs the mounting operation.

The configuration of work executing section 9 is not limited in the work devices other than component mounting device 1. For example, work executing section 9 of the solder printing device executes a solder printing operation on board K. In other industrial fields, work executing section 9 performs assembly work, processing work, and the like. A power source for operating work executing section 9 is supplied via movable element 8.

Power cable 95 is used to supply power to linear drive coil 84 and work executing section 9. As shown in FIGS. 2 and 4, power cable 95 is disposed on the upper side of central support plate 26 and bent in a U-shape in a lateral direction. Power supply cable 95 is a multi-core flat cable in which multiple electric wires are formed in two rows. Power cable 95 is also a flexible cable that flexibly deforms in accordance with the movement of movable element 8.

As shown in FIG. 2, two air introducing fans 2A are provided at positions along centerline on the upper portion of central support plate 26. As shown in FIG. 3, the two air introducing fans 2A are spaced apart from each other in the Y-axis direction. Air introducing fans 2A introduce air outside the device into work space 31. There are no particular restrictions on the structure and blowing capacity of air introducing fans 2A, and the number of air introducing fans 2A is not limited to two.

3. Configuration of Cover 3

Figure 5:
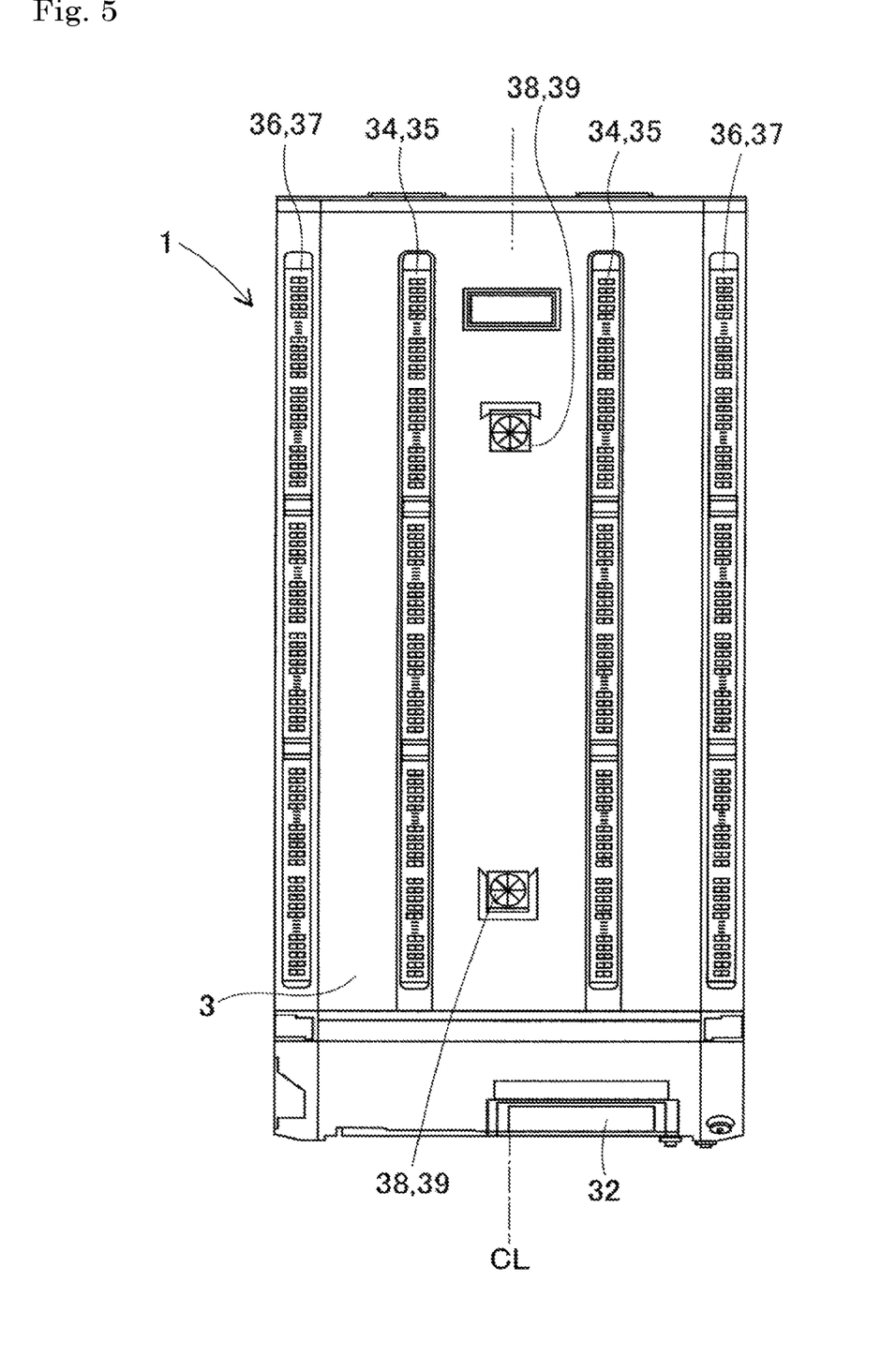
FIG. 5 A plan view of a component mounting device showing a cover forming part of an air-cooled heat-dissipating structure.

Next, the configuration of cover 3 related to the air-cooled heat-dissipating structure will be described. FIG. 5 is a plan view of component mounting device 1 showing cover 3 forming part of the air-cooled heat-dissipating structure. As shown in FIG. 5, except for monitor device 32, cover 3 is configured symmetrically to the right and left of centerline CL.

Cover 3 has two intake openings 34, two exhaust openings 36, and two air introduction openings 38. Intake opening 34 corresponds to intake port 862 of duct 86 in the transfer region in which movable element 8 moves in the transfer direction. Specifically, intake opening 34 is longer than intake port 862 and extends through most of the region in the Y-axis direction of cover 3. Regardless of where movable element 8 is located in the transfer region, intake opening 34 is open approximately at a position directly above intake port 862, as shown in FIG. 2. Dust-proof filter 35 is attached to intake opening 34.

Exhaust opening 36 corresponds to exhaust port 866 of duct 86 in the transfer region in which movable element 8 moves in the transfer direction. Specifically, exhaust opening 36 is longer than exhaust port 866 and substantially as long as intake opening 34, and extends through most of the region in the Y-axis direction of cover 3. Regardless of the position of movable element 8 in the transfer region, exhaust opening 36 opens at a position obliquely above exhaust port 866, as shown in FIG. 2. Exhaust opening 36 is also provided with dust-proof filter 37. Air introduction openings 38 are disposed at positions directly above air introducing fans 2A. Air introduction openings 38 are also provided with dust-proof filters 39.

4. Operation, Action, and Effect of Component Mounting Device 1

Figure 6:
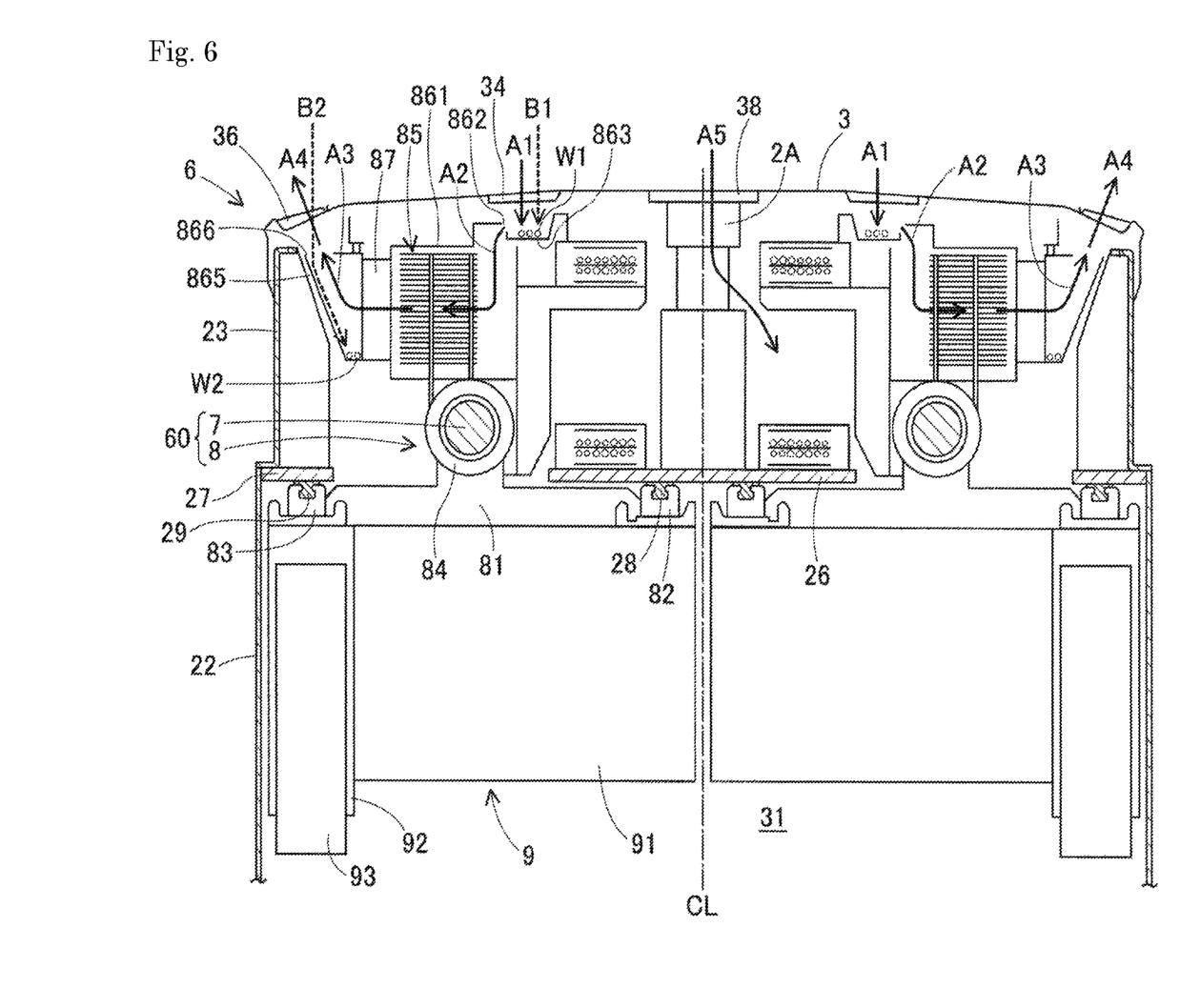
FIG. 6 A front cross-sectional view showing the operation, action, and effect of the component mounting device.

FIG. 6 is a front cross-sectional view showing the operation, action, and effect of component mounting device 1. FIG. 6 reproduces the configuration shown in FIG. 2. When component mounting device 1 starts mounting work, blowers 87 and air introducing fans 2A are automatically operated. Along with executing the mounting work, movable element 8 moves in the Y-axis direction. Since intake opening 34 extends in the Y-axis direction, the positional relationship between intake opening 34 and intake port 862 shown in FIG. 6 is maintained regardless of the position of movable element 8. Similarly, since exhaust opening 36 extends in the Y-axis direction, the oblique positional relationship in the up-down direction between exhaust opening 36 and exhaust port 866 shown in FIG. 6 is maintained regardless of the position of movable element 8.

Due to the intake function of blower 87, low-temperature air outside the device is drawn into the device from intake opening 34 as indicated by arrow A1. With this configuration, filter 35 prevents dust floating in the air from entering. The drawn-in low-temperature air flows into intake duct 861 via intake port 862 as indicated by arrow A2 and flows through the gaps between multiple heat-dissipating fins 851. As a result, heat is efficiently dissipated by heat-dissipating fins 851. Intake side tray 863 does not hinder the inflow of air into intake duct 861.

The air, which becomes hot by receiving heat via heat-dissipating fins 851, passes through blower 87 and enters exhaust duct 865 as indicated by arrow A3. Further, the high-temperature air blows obliquely upward inside exhaust duct 865. Then, as indicated by arrow A4, high-temperature air is discharged to the outside of the device obliquely upward through exhaust opening 36 located on an extension line of the upward blowing direction from exhaust port 866. Filter 37 of exhaust opening 36 prevent dust from entering the device when blower 87 is stopped.

The positional relationship between intake opening 34 and intake port 862 is suitable for intake air, and the positional relationship between exhaust opening 36 and exhaust port 866 is suitable for exhaust air. In addition, intake side tray 863 and internal flow control member 867 restricts internal flow of air in the device. With this configuration, low-temperature air outside the device is directly taken into heat-dissipating section 85 from intake opening 34 of cover 3 via intake port 862 of duct 86. The air which becomes hot in heat-dissipating section 85 is directly discharged to the outside of the device from exhaust port 866 of duct 86 and through exhaust opening 36 of cover 3. Accordingly, it is not necessary to ventilate work space 31 in the device, and drawing in air and discharging exhaust air are performed efficiently. As a result, component mounting device 1 is excellent in heat-dissipating performance.

In addition, since duct 86 moves together with movable element 8, duct 86 is small without extending a long distance into the transfer region, and instead, intake opening 34 and exhaust opening 36 of cover 3 extend across the transfer region. Further, since blower 87 is intended for the volume of heat-dissipating section 85 which is much smaller than work space 31, blower 87 can be reduced in size. Therefore, the air-cooling type heat-dissipating structure has a simpler configuration than a conventional one, and an increase in bulkiness of component mounting device 1 is avoided.

Intake ports 862 and exhaust ports 866 of ducts 86 of movable element 8 of the two, left and right, linear motors 60 are arranged symmetrically to the right and left of centerline CL. Correspondingly, the two intake openings 34 and the two exhaust openings 36 of cover 3 are also arranged symmetrically to the right and left of centerline CL. In addition, exhaust ports 866 and exhaust openings 36 exhaust hot air away from intake openings 34. Therefore, the high-temperature air discharged from the exhaust opening 36 does not reach the intake opening 34, and good heat-dissipation performance is maintained.

Further, air introducing fans 2A introduce air outside the device into work space 31 as indicated by arrow A5 in FIG. 6 and keep work space 31 at a positive pressure. In this way, intrusion of dust from the openings and the like of base 2 is prevented. In addition, cover 3 has air introduction openings 38, for introducing air into work space 31, between the two intake openings 34. With this configuration, since air introduction openings 38 are disposed away from exhaust openings 36, high-temperature air is not introduced into the device. Further, compared with the prior art in which work space 31 is ventilated, a small-size air introducing fan 2A can be used.

Although component mounting device 1 generally operates under indoor-use conditions, water droplets in the air are possible. Droplet-proof specifications assuming the presence of water droplets in the air are stipulated in various standards. As indicated by dashed arrow B1 in FIG. 6, water droplets W1 may enter the device from intake opening 34 of cover 3 and through intake port 862. Despite this, water droplets W1 are captured by intake side tray 863.

Also, as indicated by dashed arrow B2, water droplets W2 may enter the device from exhaust opening 36 of cover 3 and through exhaust port 866. Despite this, water droplets W2 are trapped by exhaust duct 865. In other words, exhaust duct 865 also serves as an exhaust side tray. Due to the protective action of intake side tray 863 and exhaust duct 865, water droplets W1 and water droplets W2 do not reach linear motor 60, work executing section 9, and the like, which are vulnerable to water. With this configuration, component mounting device 1 satisfies predetermined droplet-proof specifications.

5. Applications and Modifications of Embodiments

Component mounting device 1 may include only one set of linear motors 60. In this embodiment, cover 3 has one intake opening 34 and one exhaust opening 36. Air introducing fans 2A may be omitted. Further, the structure of linear motor 60 and the configuration of work executing section 9 can be appropriately modified. For example, heat-dissipating section 85 may dissipate heat generated in work executing section 9. Various other applications and modifications of the embodiment are possible.

INDUSTRIAL APPLICABILITY

The work device having the air-cooling type heat-dissipating structure described in the embodiment can be used for various work devices in various industrial fields in addition to component mounting device 1.

REFERENCE SIGNS LIST

1: Component mounting device (Work device of the embodiment), 2: Base, 2A: Air introducing fan, 3: Cover, 31:

Work space, 34: Intake opening, 36: Exhaust opening, 38: Air introduction opening, 4: Board conveyance section, 5: Component supply section, 6: Component transfer section, 60: Linear motor, 7: Stator, 8: Movable element, 81: Movable body, 84: Linear drive coil, 85: Heat-dissipating section, 86: Duct, 861: Intake duct, 862: Intake port, 863: Intake side tray, 865: Exhaust duct, 866: Exhaust port, 87: Blower, 9: Work executing section, CL: Centerline.

The invention claimed is:

1. A work device comprising:
   a cover provided on a base configured to form a work space between the cover and the base;
   a linear motor disposed in the work space, the linear motor having an extended stator and a movable element moving along the stator in a transfer direction; and
   a work executing section provided on the movable element to execute a predetermined work;
   wherein the movable element includes:
      a heat-dissipating section configured to dissipate heat generated from a constituent member to air, the constituent member constituting at least one of the movable element and the work executing section;
      a duct covering the heat-dissipating section, the duct including an intake duct with an intake port provided on an upper portion of the intake duct, and an exhaust duct with an exhaust port provided on an upper portion of the exhaust duct; and
      a blower configured to draw in the air into the intake duct from the intake port and blow the air to the exhaust port through the exhaust duct;
   wherein the exhaust duct includes a first face on a side in contact with the blower extending vertically and a second face on a side opposite to the blower having an inclined surface being further away from the blower as the inclined surface extends vertically; and
   wherein the cover includes:
      an intake opening corresponding to the intake port in a transfer region in which the movable element moves in the transfer direction; and
      an exhaust opening corresponding to the exhaust port in the transfer region.

2. The work device according to claim 1,
   wherein a pair of the linear motors are arranged in parallel with a centerline of the work space,
   wherein the intake port and the exhaust port of the duct of each of the two movable elements corresponding to the two linear motors are arranged symmetrically on the left and right of the centerline, and
   wherein the cover includes the two intake openings and the two exhaust openings.

3. The work device according to claim 2,
   wherein the two intake ports are located closer to the centerline than the two exhaust ports, and
   wherein the cover has an air introduction opening, between the two intake openings, configured to introduce air into the work space.

4. The work device according to claim 1, wherein the duct has a tray configured to capture water droplets that may enter from at least one of the intake port and the exhaust port.

5. The work device according to claim 1, wherein the constituent member is a linear drive coil constituting the movable element.

6. The work device according to claim 1, wherein the intake port is disposed vertically higher than the exhaust port.

7. A work device comprising:
   a cover provided on a base configured to form a work space between the cover and the base;
   a linear motor disposed in the work space, the linear motor having an extended stator and a movable element moving along the stator in a transfer direction; and
   a work executing section provided on the movable element to execute a predetermined work;
   wherein the movable element includes:
      a heat-dissipating section configured to dissipate heat generated from a constituent member to air, the constituent member constituting at least one of the movable element and the work executing section;
      a duct configured to cover the heat-dissipating section and move with the movable element, the duct including an intake port and an exhaust port; and
      a blower configured to blow the air from the intake port to the exhaust port; and
   wherein the cover includes:
      an intake opening corresponding to the intake port moving with the movable element in a transfer region in which the movable element moves in the transfer direction; and
      an exhaust opening corresponding to the exhaust port moving with the movable element in the transfer region.

* * * * *